US009027241B2

(12) United States Patent
Mehdizadeh et al.

(10) Patent No.: US 9,027,241 B2
(45) Date of Patent: May 12, 2015

(54) METHOD OF ASSEMBLING A MEDICAL ELECTRICAL LEAD

(75) Inventors: Bruce R. Mehdizadeh, Savage, MN (US); Thomas C. Bischoff, Minneapolis, MN (US); Scott J. Robinson, Forest Lake, MN (US); Eric M. Stetz, Coon Rapids, MN (US); James W. Millin, Eden Prairie, MN (US)

(73) Assignee: Medtronic, Inc., Minneapolis, MN (US)

( * ) Notice: Subject to any disclaimer, the term of this patent is extended or adjusted under 35 U.S.C. 154(b) by 2084 days.

(21) Appl. No.: 12/025,403

(22) Filed: Feb. 4, 2008

(65) Prior Publication Data

US 2008/0120836 A1 May 29, 2008

Related U.S. Application Data

(62) Division of application No. 11/321,381, filed on Dec. 29, 2005, now Pat. No. 7,326,083.

(51) Int. Cl.

| | |
|---|---|
| ***H01R 43/00*** | (2006.01) |
| ***H05K 13/00*** | (2006.01) |
| ***H01R 24/58*** | (2011.01) |
| *H01R 105/00* | (2006.01) |

(52) U.S. Cl.

CPC ............ *H01R 24/58* (2013.01); *H01R 2105/00* (2013.01); *H01R 2201/12* (2013.01); *Y10S 439/909* (2013.01)

(58) Field of Classification Search

CPC ..... A61N 1/05; A61N 1/3758; A61N 1/3787; A61N 1/048; A61N 1/372; A61B 5/0428

USPC ........... 29/854, 530, 858, 872, 876, 879, 883, 29/884; 439/587, 607.12, 669, 909; 607/27, 116, 119, 122

See application file for complete search history.

(56) References Cited

U.S. PATENT DOCUMENTS

| | | | | |
|---|---|---|---|---|
| 4,572,605 | A | 2/1986 | Hess | |
| 4,922,607 | A | 5/1990 | Doan et al. | |
| 4,944,088 | A | 7/1990 | Doan et al. | |
| 5,304,219 | A | 4/1994 | Chernoff et al. | |
| 5,514,172 | A | 5/1996 | Mueller | |
| 5,968,086 | A | 10/1999 | Bonner | |
| 6,643,550 | B2 | 11/2003 | Westlund et al. | |
| 6,854,994 | B2 | 2/2005 | Stein et al. | |
| 6,895,276 | B2 | 5/2005 | Kast et al. | |
| 6,895,277 | B2 | 5/2005 | Westlund et al. | |
| 6,912,423 | B2 | 6/2005 | Ley et al. | |
| 7,242,987 | B2 * | 7/2007 | Holleman et al. | 607/122 |
| 2004/0260373 | A1 | 12/2004 | Ries | |
| 2005/0221671 | A1 | 10/2005 | Lyu et al. | |
| 2005/0288761 | A1 | 12/2005 | Brabec | |
| 2006/0122679 | A1 | 6/2006 | Wengreen | |

* cited by examiner

*Primary Examiner* — Thiem Phan
(74) *Attorney, Agent, or Firm* — Michael C. Soldner

(57) ABSTRACT

A method of assembling a medical electrical lead. The method comprises providing a modular connector assembly including three contacts coupled to three contact conductors, selecting a lead body assembly from a group of different lead body assemblies which includes a first lead body assembly having only two conductors for and a second lead body assembly having three conductors; and coupling each of the conductors of the selected lead body assembly with a corresponding contact conductor of the modular connector assembly.

9 Claims, 8 Drawing Sheets

55
100
101
102
103
13
17
600A
63
11
12
61
62
220
225
221
222
239
228
622
621
625

612
600B
62
13
11
61
63
220'
223
221
239
623
621
625

METHOD OF ASSEMBLING A MEDICAL ELECTRICAL LEAD

CROSS REFERENCE TO PRIORITY APPLICATION

This application is a divisional of U.S. patent application Ser. No. 11/321,381, filed Dec. 29, 2005 now U.S. Pat. No. 7,326,083, which is incorporated by reference herein.

FIELD OF THE INVENTION

The present invention pertains to medical electrical leads and more particularly to modular assemblies thereof.

BACKGROUND OF THE INVENTION

Medical electrical leads commonly include elongate bodies through which one or more conductors extend; the conductors couple electrodes disposed in proximity to a first, or distal terminal end with corresponding connector contacts disposed at an opposite, or proximal terminal end. The proximal, or connector ends of leads are adapted to couple with medical devices such that the connector contacts make electrical connection with medical device contacts, the connection allowing the lead electrodes to sense electrical activity and/or provide electrical stimulation.

It is common practice, in some sectors of the medical device industry, for example the pacemaker industry, to standardize the connector terminal end of leads. Some standard connector types may be applicable for a variety of different lead bodies categorized according to a number of electrodes and corresponding conductors, for example, unipolar, bipolar, tripolar and quadripolar; and/or categorized according to a type of electrode, for example, single or integrated function and active or passive fixation. It would be desirable, from a manufacturing and quality perspective, to provide a modular connector assembly that may be coupled by common methods to any lead of the different categories of leads.

SUMMARY

Embodiments of the present invention include medical electrical lead assemblies that include a modular terminal assembly. According to some methods of the present invention, the modular terminal assembly, for example a connector assembly, may be coupled to any of a number of different lead body assemblies to form a selected medical electrical lead assembly. A lead body assembly and the terminal assembly may be placed in a fixture and ends of one or more conductors extending from each assembly positioned adjacent one another for coupling of corresponding conductors.

According to some embodiments, the modular terminal assembly is a connector assembly including first and second contacts and corresponding, first and second contact conductors coupled thereto and extending distally therefrom, wherein one of the contact conductors is coupled to an electrode conductor and another of the contact conductors is terminated in electrical isolation.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description.

Embodiments of the present invention will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides practical illustrations for implementing exemplary embodiments of the present invention.

Figure 1A:
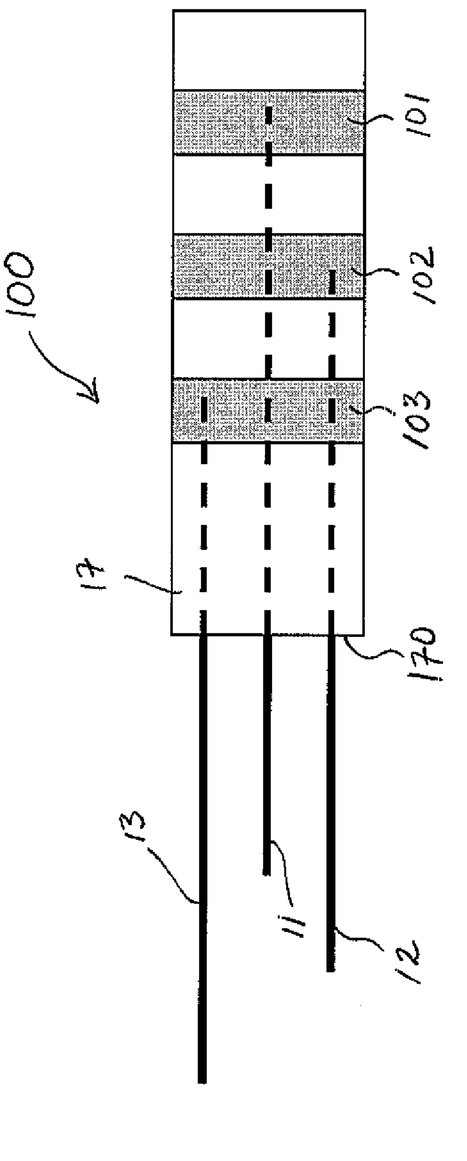
FIGS. 1A-B are a plan view and an end view of a modular connector assembly according to one embodiment of the present invention.
Figure 1B:
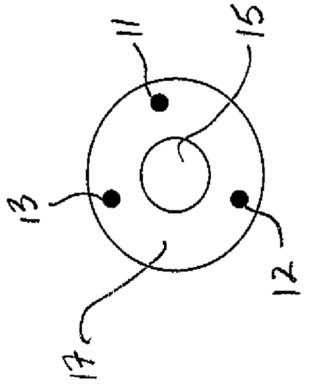

FIGS. 1A-B are a plan view and an end view of a modular connector assembly 100 according to one embodiment of the present invention. FIG. 1A illustrates connector assembly 100 including a first contact 101 coupled to a first conductor 11, a second contact 102 coupled to a second conductor 12, and a third contact 103 coupled to a third conductor 13; contacts 101, 102, 103 and associated conductors 11, 12, 13 are electrically isolated from one another and conductors 11, 12, 13 are shown extending out from an insulated portion 17 of connector assembly 100 in a generally longitudinal direction so that a distal end of each conductor 11, 12, 13 is exposed. FIG. 1A further illustrates each conductor 11, 12, 13 extending at a different length from assembly 100 such that distal ends of conductors 11, 12, 13 are staggered. FIG. 1B illustrates connector assembly 100 further including a lumen 15 extending longitudinally therethrough, that may accommodate a conductor extending from a lead body assembly. According to embodiments of the present invention, modular connector assembly 100 may have dimensions, for example contact diameter and spacing of the contacts conforming to an industry standard, and, once part of a complete medical electrical lead assembly, serves to electrically connect the lead assembly to a medical device. Suitable materials, components and assembly methods for connector assembly 100 are described in commonly assigned patent application publication number 2005/0221671, entitled "Novel Medical Electrical Connector", relevant parts of which are hereby incorporated by reference.

Figure 2:
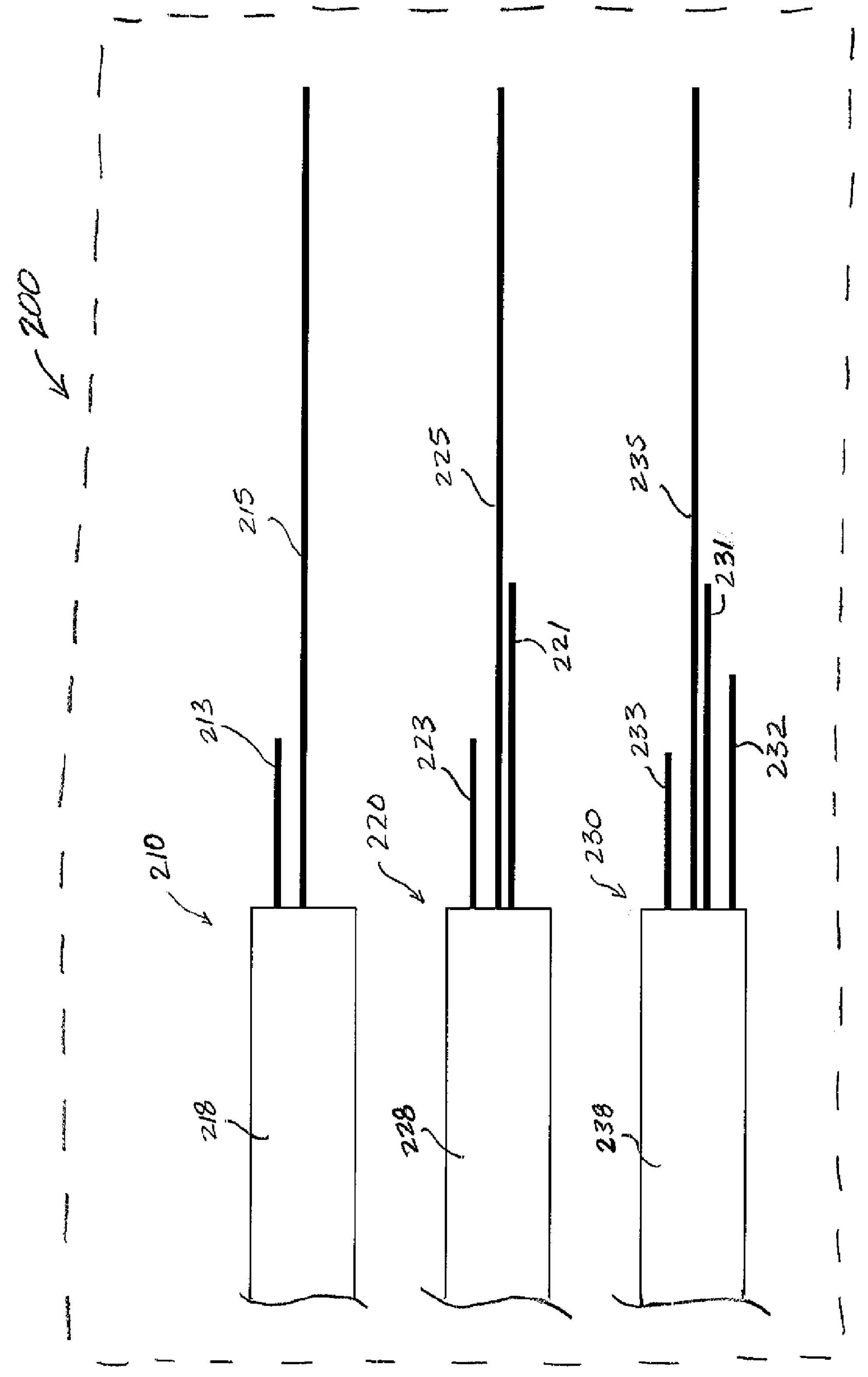
FIG. 2 is a plan view of proximal portions of exemplary lead body assemblies representative of three categories or types of assemblies included in a group.
Figure 3:
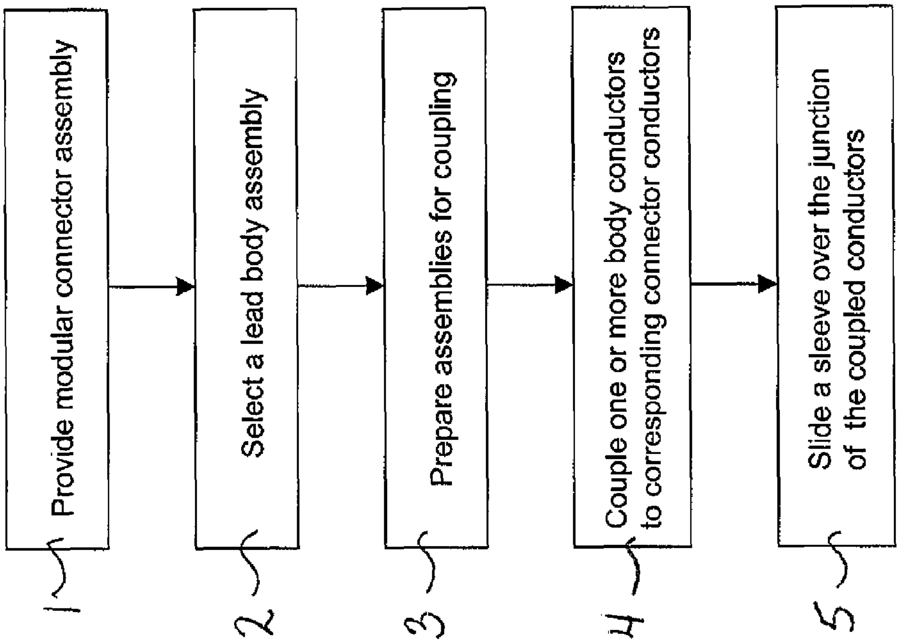
FIG. 3 shows a flow chart describing a method according to embodiments of the present invention.

FIG. 2 is a plan view of proximal portions of exemplary lead body assemblies 210, 220, and 230 representative of three categories or types of assemblies included in a group 200. According to methods of the present invention, for example, as illustrated by the flow chart of FIG. 3, any of lead body assemblies 210, 220, 230 may be selected for coupling with modular connector assembly 100 provided per step 1 shown in FIG. 3. If bipolar lead body assembly 210, including a first conductor 213 and a second conductor 215 extending proximally from an elongate insulation tube 218, is selected (step 2, FIG. 3) for coupling to modular connector assembly 100, first body conductor 213 would be coupled to connector conductor 13 and second body conductor 215 would be inserted through lumen 15 of connector assembly 100 to be coupled to a terminal connector pin, for example pin 55 shown in FIG. 5. In this case, prior to coupling (step 4, FIG. 3), modular connector assembly would be prepared (step 3, FIG. 3) by terminating connector conductors 11 and 12 in electrical isolation, for example by trimming and capping each conductor 11, 12, for example, in proximity to a distal end 170 of insulated portion 17, such that terminal ends of conductors 11, 12 cannot short to one another or to any of the other conductors. If tripolar lead body assembly 220, including a first conductor 221, a second conductor 223 and a third conductor 225 extending proximally from an elongate insulation tube 228, is selected (step 2) for coupling to modular connector assembly 100, first body conductor 221 would be coupled to connector conductor 11, second body conductor 223 would be coupled to connector conductor 13, and third body conductor 225 would be inserted through connector assembly lumen 15 as previously described for body assembly 210. In this case, prior to coupling (step 4), modular connector assembly would be prepared (step 3) as previously described except that only conductor 12 would be terminated in electrical isolation. If quadripolar lead body assembly 230, including a first conductor 231, a second conductor 232, a third conductor 233 and a fourth conductor 225 extending proximally from an elongate insulation tube 238, is selected (step 2) for coupling to modular connector assembly 100, first second and third body conductors 231, 232, 233 would each be coupled to corresponding connector conductors 11, 12, 13, and fourth body conductor 235 would be inserted through connector lumen 15 as previously described for body assembly 210. In this case, preparation of assemblies (step 3) need not include terminating any of connector conductors 11, 12, 13 in electrical isolation.

Although connector assembly 100 includes lumen 15, and each lead body assembly 210, 220, 230 include conductors 215, 225, 235, respectively, intended for insertion through lumen 15, it should be understood that the scope of the present invention is not so limited. According to alternate embodiments of the present invention, modular connector assemblies do not include a lumen like lumen 15 and different categories of lead body assemblies do not include conductors of a length that would extend into a mating modular connector assembly.

Figure 6:
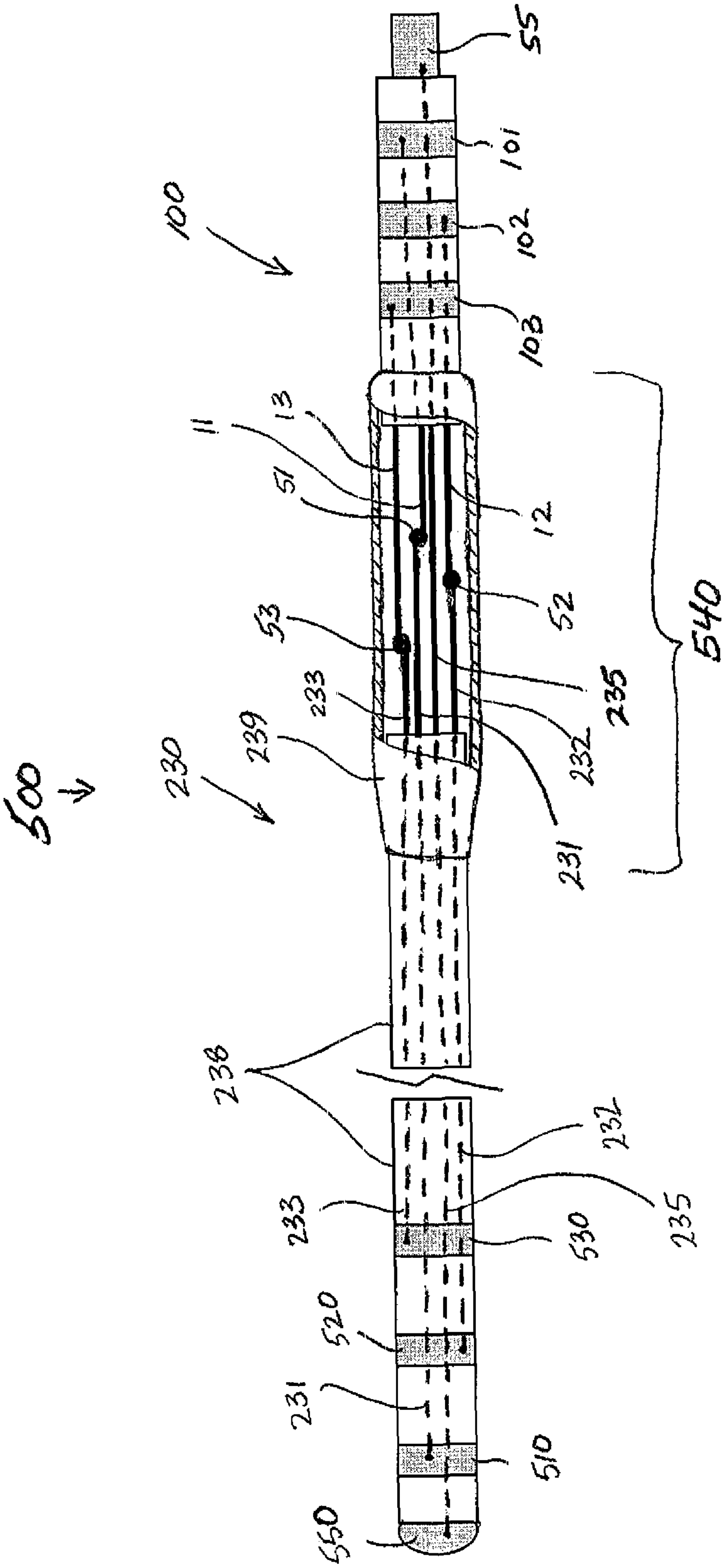
FIG. 6 is a plan view of a lead assembly, according to some embodiments of the present invention.

Those skilled in the art will appreciate that the conductors of each assembly 210, 220, 230 are electrically isolated from one another and extend distally within respective tubes 218, 228, 238, for example, each conductor within an independent lumen thereof. Each conductor is coupled with respective electrodes or sensors mounted in proximity to a distal end of each tube 218, 228, 238, for example, as illustrated for assembly 230, which is a part of a complete lead assembly 500 shown in FIG. 6. FIG. 6 illustrates conductors 231, 232, 233 and 235 extending distally within insulation tube 238 to couple with respective electrodes 510, 520, 530 and 550; according to an exemplary embodiment, electrodes 510 and 550 form a pace/sense pair, and electrodes 520 and 530 are high voltage defibrillation electrodes. Suitable materials and construction methods for appropriate medical electrical lead body assemblies are well known to those skilled in the art.

Figure 4:
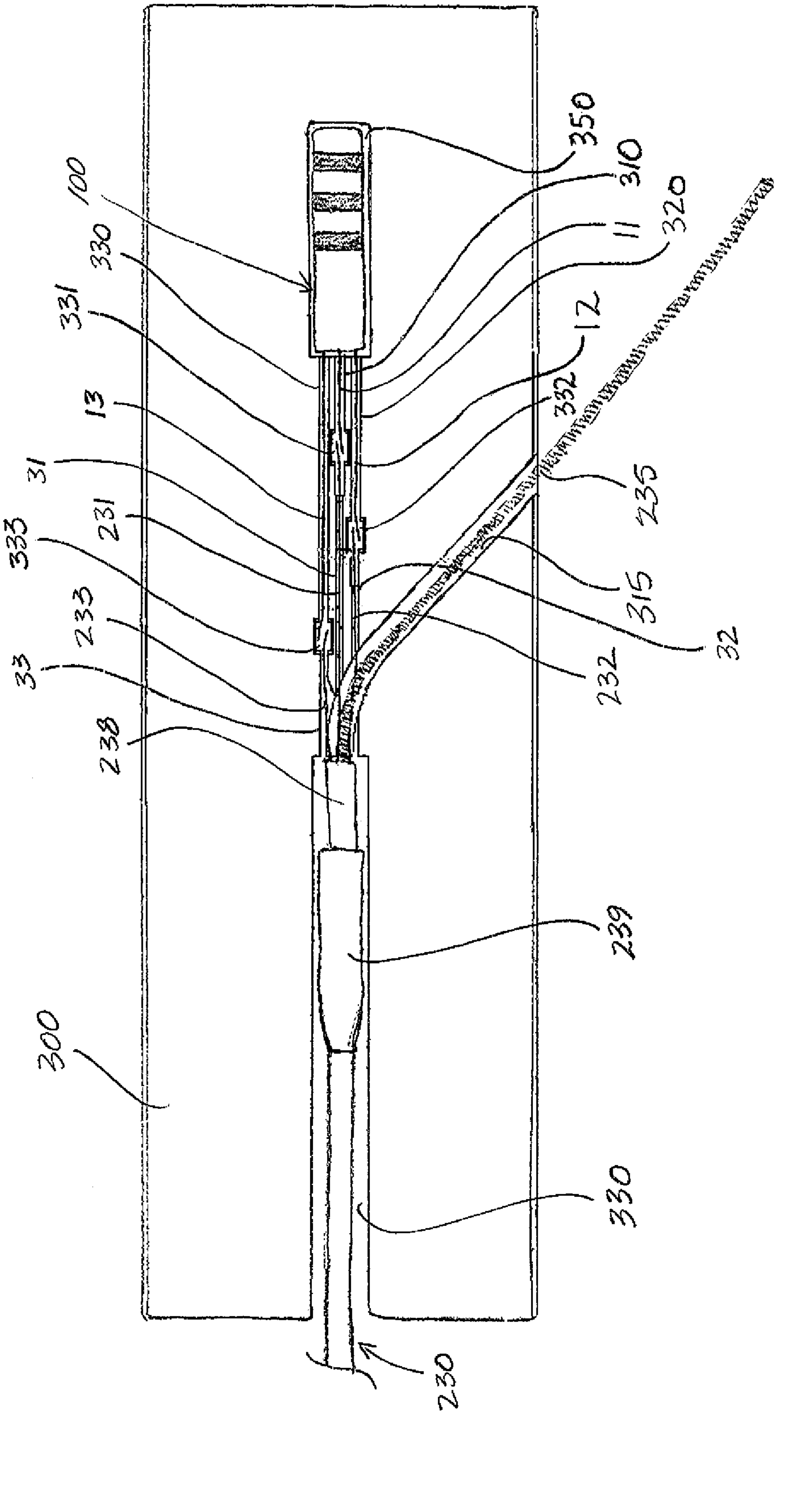
FIG. 4 is a top view of a fixture in which one of the lead body assemblies, shown in FIG. 2, and a modular connector assembly are placed, according to some methods of the present invention.

FIG. 4 is a top view of a portion of a fixture 300 in which lead body assembly 230 and modular connector assembly 100 are placed for coupling, according to some methods of the present invention. It should be recognized that fixture 300 will accommodate any of lead body assemblies 210, 220, 230 shown in FIG. 2. FIG. 4 illustrates fixture 300 including three conductor channels 31, 32 and 33 extending, approximately parallel to one another, from a lead body channel 330, a bypass channel 315, three conductor channels 310, 320 and 330 extending, approximately parallel to one another, from a connector channel 350, and three coupling receptacles 331, 332 and 333, each disposed at a junction of mating conductor channels 31/310, 32/320, and 33/330. Fixture 300 may be formed from any relatively hard and stiff material, for example steel or a hard plastic.

Figures 7A, 7B:
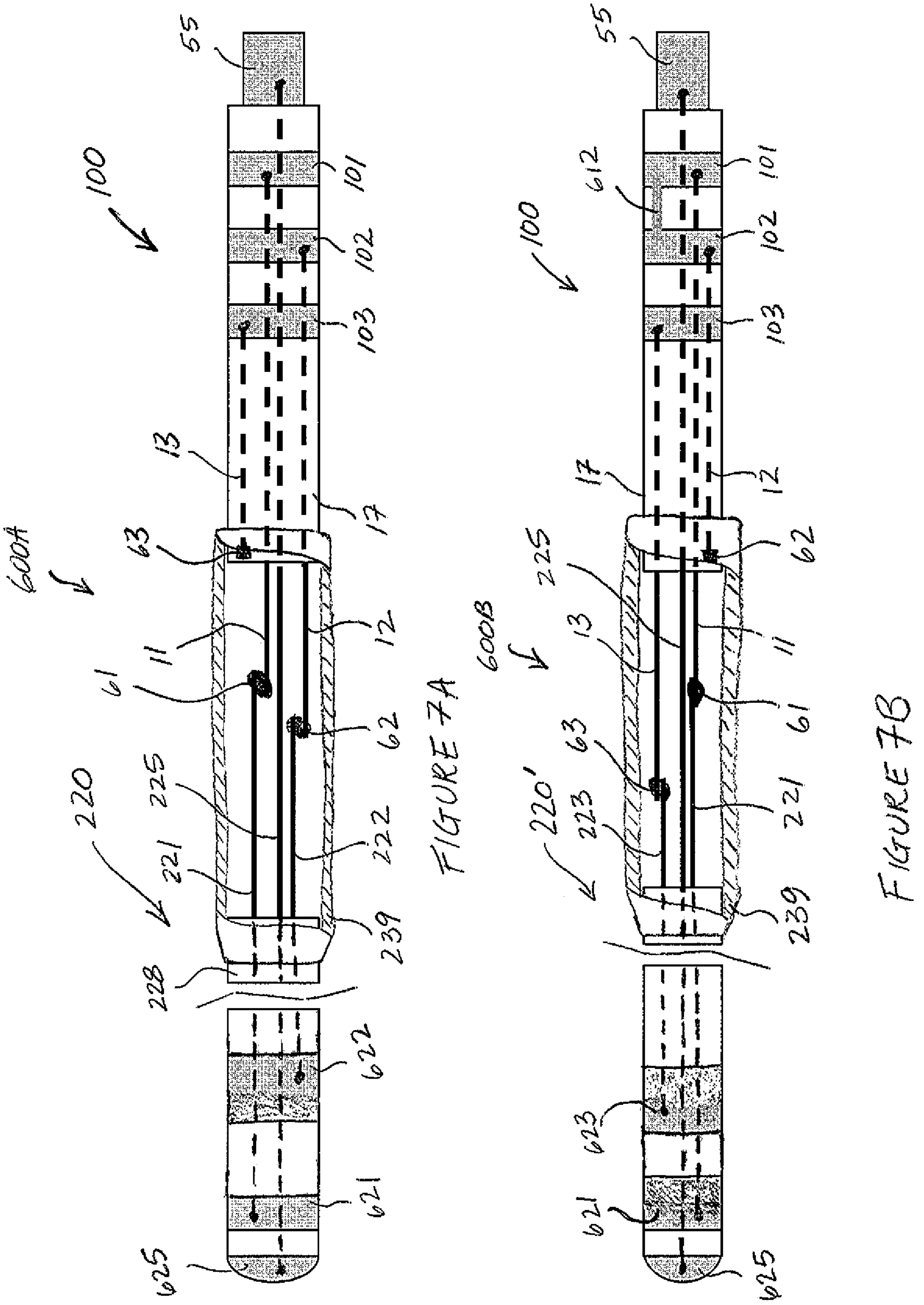
FIGS. 7A-B are plan views of alternate exemplary tripolar medical electrical lead assemblies, each including a lead body assembly and the modular connector assembly, according to some embodiments of the present invention.

FIG. 4 further illustrates lead body assembly 230 held in lead body channel 330 and body conductors 231, 232, 232 extending in respective channels 31, 32, 33 such that proximal ends of conductors 232, 232, 233 are disposed in respective coupling receptacles 331, 332, 333 adjacent to respective distal ends of contact conductors 11, 12, 13 extending from connector assembly 100, which is held in connector channel 350. Lead body conductor 235 is shown routed laterally away from the approximately parallel conductor channels so that conductor 235 does not interfere with the coupling of body conductors 231, 232, 233 to respective contact conductors 11, 12, 13; conductor 235 can be inserted through lumen 15 (FIG. 1B) of connector assembly 100, after conductor coupling, for example to be coupled to terminal connector pin 55 (FIGS. 6, 7A-B). According to some embodiments of the present invention, coupling receptacles 331, 332, 333 are each sized to receive a coupling component, for example a weld, crimp or stake sleeve, into which the ends of corresponding conductors extend for coupling, and may each include tapered edges to prevent the coupling components from wedging therein. According to alternate embodiments, the ends of corresponding conductors are each coupled directly to one another within the corresponding receptacle. In either case, the corresponding conductor ends may extend side by side, as illustrated, or be approximately aligned end-to-end for coupling.

Figure 5A:
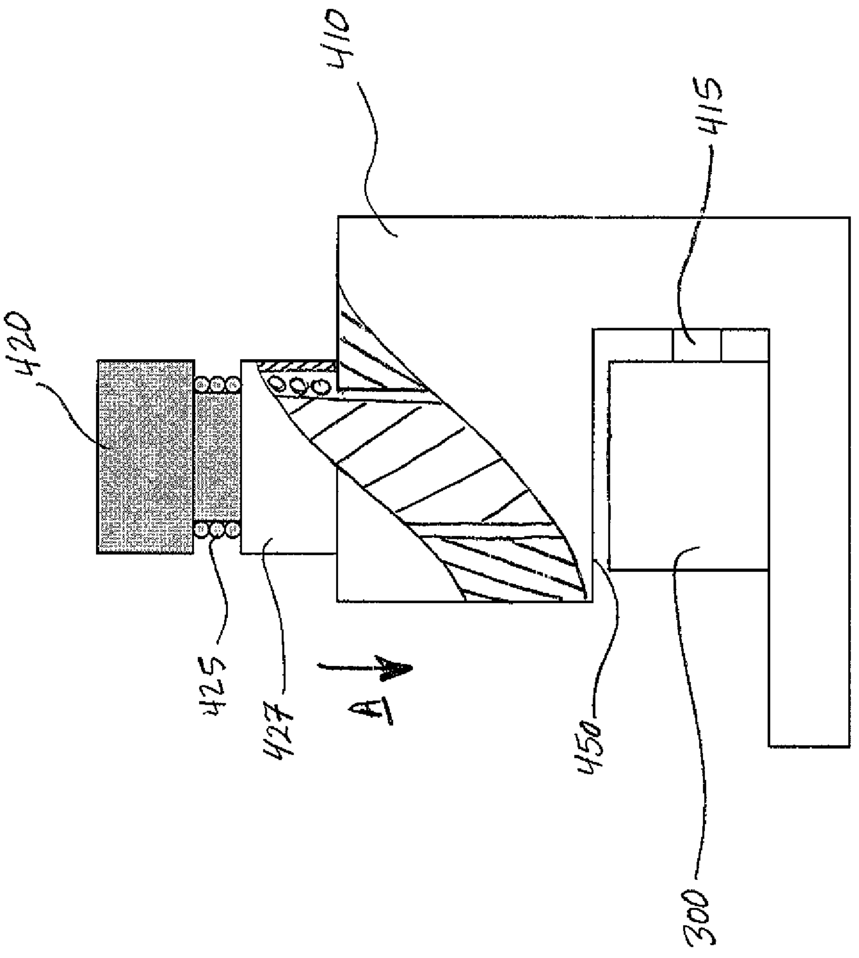
FIG. 5A is an end view, with a partial section, of a frame holding a coupling tool and the fixture shown in FIG. 4, according to some methods of the present invention.
Figure 5B:
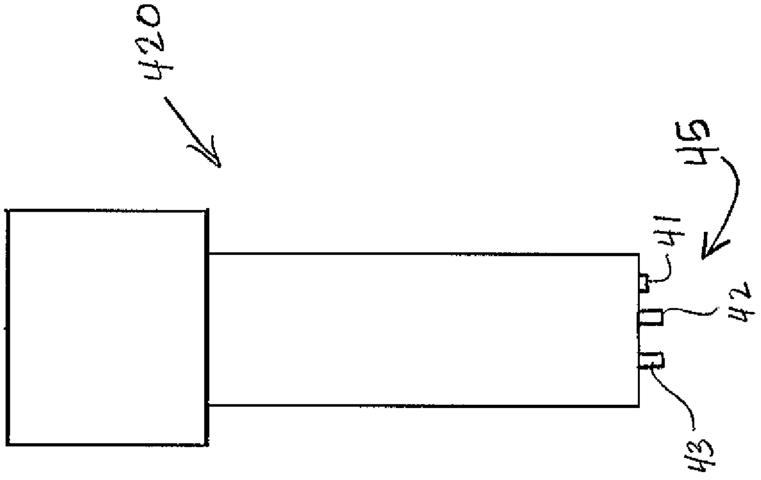
FIGS. 5B-C are a plan view and an bottom view of the coupling tool, according to some methods of the present invention.
Figure 5C:
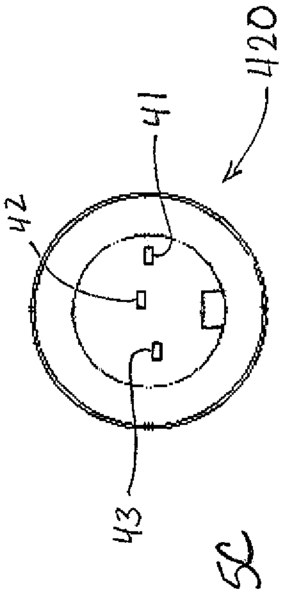

FIG. 5A is an end view, with a partial section, of a frame 410 holding a staking pin 420 and fixture 300, according to some methods of the present invention; and FIGS. 5B-C are a plan view and an bottom view of staking pin 420, according to some methods of the present invention. FIG. 5A illustrates fixture 300 held in frame 410, by at least one holding pin 415, and staking pin 420 extending vertically within frame 410. According to the illustrated embodiment, pin 420 is pressed downward, per arrow A, for example, by a pneumatic cylinder (not shown), through frame such that a staking end 45 (FIG. 5B) extends from a lower surface 450 of frame 410, residing over fixture 300, to couple ends of mating conductors, for example disposed within stake sleeves, in coupling receptacles 331, 332, 333. With reference to FIGS. 5B-C and FIG. 4, it can be seen staking pin 420 includes staking protrusions 41, 42, 43, extending from staking end 45, which are arranged to coincide with locations of coupling receptacles 331, 332, 333, when fixture 300 is held in frame 410, so that all three pairs of conductors may be coupled by protrusions 41, 42, 43 simultaneously. It should be noted that, for coupling of alternate lead body assemblies, for example assemblies 210 and 220 shown in FIG. 2, staking pin 420 may be exchanged for another pin having fewer protrusions according to the fewer number of conductors to be coupled. FIG. 5A further illustrates a compression spring 425, which returns pin 420 to an initial position after staking, and a stop collar 427 surrounding staking pin 420 to control the depth of staking. Considerations surrounding staking operations are well known to those skilled in the art.

Referring back to FIG. 4, after the conductor coupling is completed, for example by staking as described above, lead body assembly 230 and connector assembly 100 may be removed from fixture 300, conductor 235 routed through lumen 15 of connector assembly 100, and a sleeve 239, which was mounted about elongate insulation tube 238 prior to conductor coupling, slid proximally over the junction of the coupled conductors (step 5, FIG. 3) to bridge a gap between insulation tube 238 and insulation portion 17 of connector assembly 100, as illustrated in FIG. 6 where a completed assembly is shown.

FIG. 6 is a plan view of complete lead assembly 500, according to some embodiments of the present invention. FIG. 6 illustrates lead assembly 500 including lead body assembly 230, as previously described, joined to modular connector assembly 100 at a transition zone 540 where sleeve 235 surrounds junctions 51, 52, and 53 of mated conductor pairs 231/11, 232/12, and 233/13. According to some embodiments of the present invention transition zone 540 includes, beneath sleeve 239, an insulative member having channels for supporting and separating the mated conductor pairs 231/11, 232/12, 233/13 from one another, for example a multi-lumen tube; the channels may further be arranged in a helical fashion about a longitudinal axis of transition zone 540 to provide strain relief for the mated conductor pairs. Such a member that would be applicable to embodiments of the present invention is described, along with appropriate design details, in commonly assigned patent application Ser. No. 10/922,210, entitled "Novel Lead Body-to-Connector Transition Zone", relevant parts of which are hereby incorporated by reference.

FIGS. 7A-B are schematics of alternate exemplary tripolar lead assemblies 600A,B, each including a respective body assembly 220, 220' and modular connector assembly 100, according to some embodiments of the present invention. Each assembly 600A,B may be assembled according to the general methods described in conjunction with FIGS. 3-5C. FIG. 7A illustrates tripolar lead assembly 600A including connector assembly 100, wherein contact conductor 13, which had extended out from insulated portion 17 (FIG. 1A) has been cut back so that a distal end 63 thereof is contained within insulated portion 17 of connector assembly 100; since lead body assembly 220 does not provide a mating conductor for contact conductor 13, distal end 63 remains electrically isolated and contact 103 remains inactive. According to the illustrated embodiment, junctions 61 and 62 mate respective conductor pairs 11/221 and 12/222 to electrically couple an electrode 621, for example a pace/sense electrode, to contact 101, and an electrode 622, for example a defibrillation electrode, to contact 102; and third, continuous conductor 225 of lead body assembly 220 extends through connector assembly 100 to couple a tip electrode 625, for example a pace/sense electrode, to terminal connector pin 55. FIG. 6B illustrates an alternate tripolar lead assembly 600B including connector assembly 100 wherein contact conductor 12, which had extended out from insulated portion 17 (FIG. 1A), has been cut back so that a distal end 62 thereof is contained within insulated portion 17 of connector assembly 100; since lead body assembly 220' does not provide a mating conductor for contact conductor 12, distal end 62 remains electrically isolated. According to the illustrated embodiment, junctions 61 and 63 mate respective conductor pairs 11/221 and 13/223 to electrically couple an electrode 621, for example a defibrillation electrode, to contact 101, and an electrode 623, for example another defibrillation electrode, to contact 103; and third, continuous conductor 225 of lead body assembly 220' extends through connector assembly 100 to couple tip electrode 625, for example a pace/sense electrode, to terminal connector pin 55. FIG. 7B further illustrates connector assembly 100 including a short 612 between contacts 101 and 102 for integrated functionality of electrode 621, for example, so that electrode 621 may act as a defibrillation electrode, receiving defibrillation pulses from a device through contact 102, and may provide, in combination with tip electrode 625, sensed signals to the device via contact 101. According to some embodiments, short 612 is formed by a conductive strip added to modular connector assembly 100, once a lead body assembly of type 220' has been selected for coupling with connector assembly 100.

In the foregoing detailed description, the invention has been described with reference to specific embodiments. However, it may be appreciated that various modifications and changes can be made without departing from the scope of the invention as set forth in the appended claims. For example, although embodiments of modular connector assemblies described herein include three conductors and embodiments of lead body assemblies include up to four conductors, it should be recognized that the scope of the invention is not so limited and inventive connector assemblies and corresponding lead body assemblies may have any number of conductors, for example from two up to eight or ten, or whatever number is feasible and required for a particular application of a medical electrical lead.

The invention claimed is:

1. A method for assembling a medical electrical lead, the method comprising:

providing a modular connector assembly, the connector assembly including three contacts and three contact conductors, each of the three contact conductors coupled to a corresponding contact of the three contacts;

selecting only one lead body assembly from a group of different lead body assemblies, the group including:

a first lead body assembly having only two conductors for coupling with the contact conductors, and a second lead body assembly having three conductors for coupling with the contact conductors; and coupling each of the conductors of the selected lead body assembly with a corresponding contact conductor of the modular connector assembly; and wherein the selecting step comprises selecting only the first lead body assembly having only two conductors for coupling with the contact conductors.

2. The method of claim 1 wherein the group of different lead body assemblies further includes a third lead body assembly having only one conductor for coupling with the contact conductors, wherein the selecting step comprises selecting the third lead body assembly having only one conductor for coupling with the contact conductors.

3. The method of claim 1, wherein the modular connector assembly further includes dimensions conforming to an industry standard.

4. The method of claim 1, wherein:

the connector assembly and the selected lead body assembly each include a longitudinal axis;

the contact conductors extend out from the connector body in a generally longitudinal direction; and the conductors of the selected lead body assembly extend out from the lead body in a generally longitudinal direction; and further comprising, aligning an end of each of the conductors of the selected lead body assembly with an end of each of the corresponding contact conductors for coupling.

5. A method for assembling a medical electrical lead, the method comprising:

providing a modular connector assembly, the connector assembly including three contacts and three contact conductors, each of the three contact conductors coupled to a corresponding contact of the three contacts;

selecting a lead body assembly from a group of different lead body assemblies, the group including:

a first lead body assembly having only two conductors for coupling with the contact conductors, and a second lead body assembly having three conductors for coupling with the contact conductors; and coupling each of the conductors of the selected lead body assembly with a corresponding contact conductor of the modular connector assembly;

the connector assembly and the selected lead body assembly each include a longitudinal axis;

the contact conductors extend out from the connector assembly in a generally longitudinal direction; and the conductors of the selected lead body assembly extend out from the lead body assembly in a generally longitudinal direction; and further comprising, positioning an end of each of the conductors of the selected lead body assembly in close proximity to an end of each of the corresponding contact conductors for coupling; and wherein the selecting step comprises selecting only the first lead body assembly having only two conductors for coupling with the contact conductors.

6. A method for assembling a medical electrical lead, the method comprising:

providing a modular connector assembly, the connector assembly including three contacts and three contact conductors, each of the three contact conductors coupled to a corresponding contact of the three contacts;

selecting a lead body assembly from a group of different lead body assemblies, the group including:

a first lead body assembly having only two conductors for coupling with the contact conductors, and a second lead body assembly having three conductors for coupling with the contact conductors; and coupling each of the conductors of the selected lead body assembly with a corresponding contact conductor of the modular connector assembly; wherein:

the connector assembly and the selected lead body assembly each include a longitudinal axis;

the contact conductors extend out from the connector assembly in a generally longitudinal direction; and the conductors of the selected lead body assembly extend out from the lead body assembly in a generally longitudinal direction; and further comprising, aligning an end of each of the conductors of the selected lead body assembly with an end of each of the corresponding contact conductors for coupling; and wherein the selecting step comprises selecting only the first lead body assembly having only two conductors for coupling with the contact conductors.

7. A method for assembling a medical electrical lead, the method comprising:

providing a modular connector assembly, the connector assembly including three contacts and three contact conductors within an insulative connector body, each of the three contact conductors coupled to a corresponding contact of the three contacts;

selecting only one lead body assembly from a group of different lead body assemblies, the group including:

a first lead body assembly having only two conductors extending longitudinally within an insulative lead body for coupling with the contact conductors, and a second lead body assembly having three conductors extending longitudinally within an insulative lead body for coupling with the contact conductors; and coupling each of the conductors of the selected lead body assembly with a corresponding contact conductor of the modular connector assembly; and wherein the selecting step comprises selecting only the first lead body assembly having only two conductors for coupling with the contact conductors.

8. The method of claim 7 wherein the group of different lead body assemblies further includes a third lead body assembly having only one conductor extending longitudinally within an insulative lead body for coupling with the contact conductors, wherein the selecting step comprises selecting the third lead body assembly having only one conductor for coupling with the contact conductors.

9. The method of claim 7, wherein:

the connector assembly and the selected lead body assembly each include a longitudinal axis;

the contact conductors extend out from the connector body in a generally longitudinal direction; and the conductors of the selected lead body assembly extend out from the lead body in a generally longitudinal direction; and further comprising, aligning an end of each of the conductors of the selected lead body assembly with an end of each of the corresponding contact conductors for coupling.

* * * * *